United States Patent
Song et al.

(10) Patent No.: US 8,412,658 B2
(45) Date of Patent: Apr. 2, 2013

(54) SYSTEM AND METHOD FOR ESTIMATING LONG TERM CHARACTERISTICS OF BATTERY

(75) Inventors: Hyun-Kon Song, Daejeon (KR); Jeong-Ju Cho, Daejeon (KR); Yeon-Uk Choo, Seoul (KR); Mi-Young Son, Daejeon (KR); Ho-Chun Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 442 days.

(21) Appl. No.: 12/678,094

(22) PCT Filed: Sep. 12, 2008

(86) PCT No.: PCT/KR2008/005403
§ 371 (c)(1),
(2), (4) Date: Aug. 27, 2010

(87) PCT Pub. No.: WO2009/035288
PCT Pub. Date: Mar. 19, 2009

(65) Prior Publication Data
US 2010/0312733 A1 Dec. 9, 2010

(30) Foreign Application Priority Data
Sep. 13, 2007 (KR) .................. 10-2007-0093251

(51) Int. Cl.
*G06N 3/08* (2006.01)
(52) U.S. Cl. ............ 706/25; 320/132; 324/426; 702/63; 702/64; 702/193
(58) Field of Classification Search .......... 706/25; 320/132; 324/426; 702/63, 64, 193
See application file for complete search history.

(56) References Cited

U.S. PATENT DOCUMENTS
4,361,809 A * 11/1982 Bil et al. ................ 324/426
5,714,866 A * 2/1998 S et al. .................. 320/152
(Continued)

FOREIGN PATENT DOCUMENTS
JP 2006-138858 A 6/2006
KR 10-2004-0051195 A 6/2004
KR 10-2005-0061386 A 6/2005

OTHER PUBLICATIONS
Young et al., "Prediction of Individual Cell Performance in a long-string lead/acid peak-shaving battery: Application of Artificial Neural Networks", Journal of Power Sources 62, pp. 121-134, Sep. 1, 1996.

*Primary Examiner* — Kakali Chaki
*Assistant Examiner* — Mai T Tran
(74) *Attorney, Agent, or Firm* — Birch, Stewart, Kolasch & Birch, LLP

(57) ABSTRACT

A system includes a learning data input unit for receiving initial and long term characteristic learning data of a battery to be a learning object; a measurement data input unit for receiving initial characteristic measurement data of a battery to be an object for long term characteristic estimation; an artificial neural network operation unit for converting the learning data into first and second data structures, allowing an artificial neural network to learn the learning data based on each data structure, converting the measurement data into first and second data structures, and individually applying the learned artificial neural network corresponding to each data structure to calculate and output long term characteristic estimation data based on each data structure; and a long term characteristic evaluation unit for calculating an error of the estimation data of each data structure and determining reliability of the estimation data depending on error.

16 Claims, 8 Drawing Sheets

U.S. PATENT DOCUMENTS

| | | | |
|---|---|---|---|
| 5,825,156 A * | 10/1998 | Patillon et al. | 702/63 |
| 5,936,385 A * | 8/1999 | Patillon et al. | 320/136 |
| 5,998,968 A | 12/1999 | Pittman et al. | |
| 6,392,386 B2 | 5/2002 | Schulmayr et al. | |
| 6,526,361 B1 * | 2/2003 | Jones et al. | 702/63 |
| 6,534,954 B1 | 3/2003 | Plett | |
| 7,415,126 B2 * | 8/2008 | Breed et al. | 382/100 |
| 2006/0181245 A1 * | 8/2006 | Mizuno et al. | 320/132 |

* cited by examiner

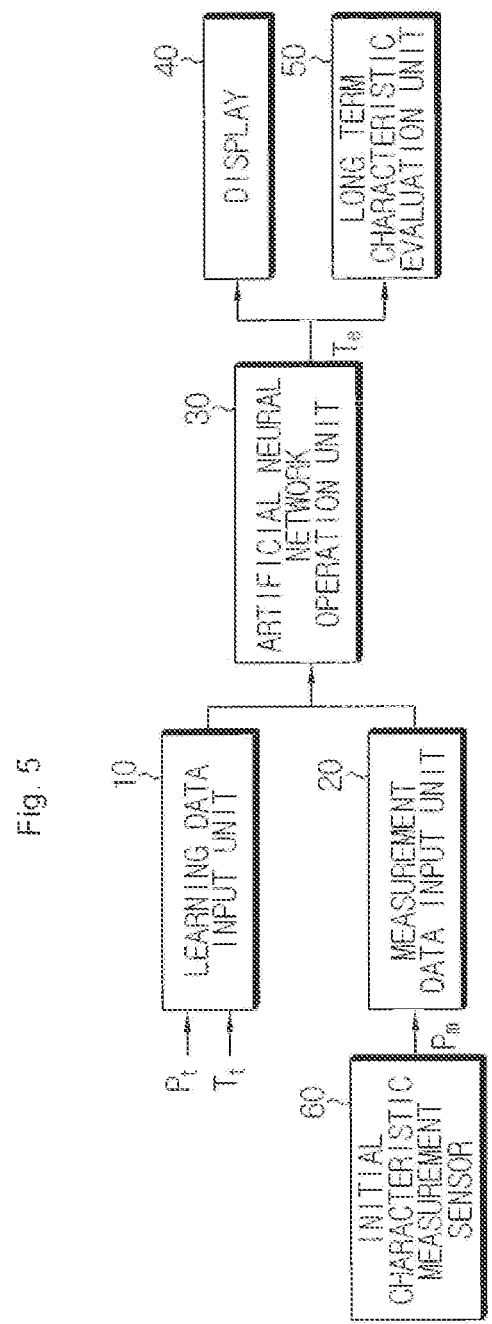

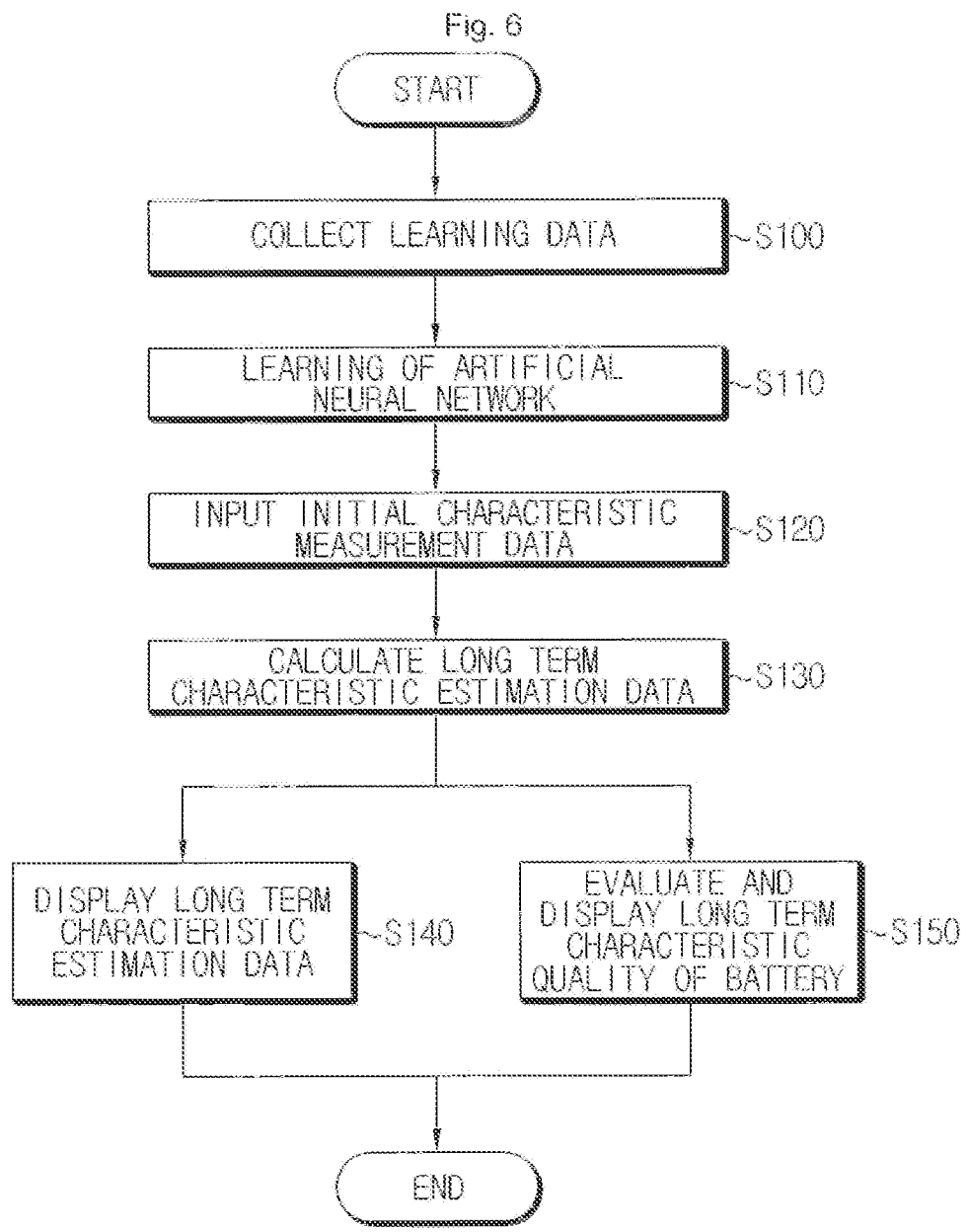

SYSTEM AND METHOD FOR ESTIMATING LONG TERM CHARACTERISTICS OF BATTERY

TECHNICAL FIELD

The present invention relates to system and method for estimating long term characteristics of a battery, and more particularly to system and method for estimating long term characteristics of a battery based on initial characteristics of the battery.

BACKGROUND ART

A battery exhibits decreased capacity and performance as its usage is increased. Thus, it is very important to design a battery such that its long term characteristics are maintained though it is used for a long time. The long term characteristics may be a charging capacity, a discharging capacity, a thickness and an open circuit voltage of a battery, as examples.

The long term characteristics of a battery are measured based on a cycle charging/discharging process. In the cycle charging/discharging process, a certain number of batteries are sampled from a produced battery lot, and then the sampled batteries are successively charged/discharged. If long term characteristics of the sampled batteries satisfy certain criteria at predetermined long term cycles, the corresponding battery lot is considered as being successful. For example, the corresponding battery lot is considered as being successful when a discharging capacity at 3V is 75% or above of an initial capacity at 300 cycle (300 time charging/discharging).

However, a long time is consumed for estimating long term characteristics of a battery. For example, a charging/discharging process of 300 cycles takes a long time of about 3 months. Thus, in order to measure long term characteristics of a battery based on the cycle charging/discharging process, shipment of batteries is delayed during the time for the charging/discharging process, thereby increasing burdens in stockpile.

Thus, in a conventional case, if one lot of batteries is produced, a certain number of batteries are sampled and then the batteries are shipped instantly, and then long term characteristics of the sampled batteries are evaluated to take suitable measures afterward, which is called 'post-shipment evaluation'. If any problem is discovered as a result of evaluation of long term characteristics after batteries are shipped, the battery lot corresponding to the sampled batteries is determined as having bad long term characteristics. After that, the shipped batteries are called back, and a countermeasure for removing a factor of such inferiority of long term characteristics is studied and then taken to a battery production process. However, such a post-shipment evaluation method shows the following problems.

First, in case any specific battery lot is determined as being bad, an economic cost (e.g., a distribution cost) is consumed in retrieving batteries of the corresponding lot.

Second, in case a battery having bad long term characteristics is sold to an end user, it is substantially impossible to take a measure to the battery, for example to retrieve the battery.

Third, in case it is determined that a defect exists in a production process as a result of analysis of inferior long characteristics, long term characteristics of all batteries produced by the same production process become in question, so loss of a manufacturer is increased as much.

Fourth, if a battery with bad long term characteristics is sold and used in an electronic product, a feeling of satisfaction for the battery is deteriorated, so reliability of a battery manufacturer and a seller is also deteriorated.

Thus, there is an urgent need to a scheme capable of reliably estimating long term characteristics of batteries in the related art before the batteries are shipped.

DISCLOSURE OF INVENTION

Technical Problem

The present invention is designed to solve the problems of the prior art, and therefore it is an object of the present invention to provide system and method for estimating long term characteristics of a battery, which enables fast inferiority determination by estimating long term characteristics of a battery based on its initial characteristics, and further enables total inspection of the battery by using characteristics measured by all batteries, for example a charge data at an activation process.

Technical Solution

In order to accomplish the above object, the present invention provides a system for estimating long term characteristics of a battery, comprising: a learning data input unit for receiving initial characteristic learning data and long term characteristic learning data of a battery to be a learning object; a measurement data input unit for receiving initial characteristic measurement data of a battery to be an object for estimation of long term characteristics; an artificial neural network operation unit for converting the initial characteristic learning data and the long term characteristic learning data into first and second data structures, allowing an artificial neural network to learn the initial characteristic learning data and the long term characteristic learning data based on each data structure, converting the input initial characteristic measurement data into first and second data structures, and individually applying the learned artificial neural network corresponding to each data structure to calculate and output long term characteristic estimation data based on each data structure; and a long term characteristic evaluation unit for calculating an error of the output long term characteristic estimation data of each data structure and determining reliability of the long term characteristic estimation data depending on the error.

Preferably, the learned artificial neural network based on each data structure has at least one neuron layer arranged in series. The neuron layer converts an input vector into an output vector. At this time, a bias vector and a weight matrix calculated by the learning of the artificial neural network are reflected on the input vector, the input vector on which the bias vector and the weight matrix are reflected is processed by a neuron transfer function, and then result of the neuron transfer function is output as an output vector. In the serial arrangement of the neuron layer, the first neuron layer has an input vector composed of initial characteristic measurement data. Also, an output vector of the last neuron layer is a long term characteristic estimation vector.

Preferably, wherein the data relating to initial characteristics includes a charging characteristic variation data of a battery, measured in a battery activating process; or a charging characteristic variation data, a discharging characteristic variation data, a thickness variation data, or an open circuit voltage variation data of a battery, obtained by measurement of initial cycle characteristics. Also, the data relating to long term characteristics includes a charging characteristic variation data, a discharging characteristic variation data, a thickness variation data, or an open circuit voltage variation data of a battery at predetermined long term cycles.

The system according to the present invention may further include an initial characteristic measurement sensor for measuring a charging characteristic of a battery put into an activating process and then outputting the measured charging characteristic as an initial characteristic measurement data, and the measurement data input unit may receive the initial characteristic measurement data from the initial characteristic measurement sensor.

The system according to the present invention may further include a display for receiving the long term characteristic estimation data calculated based on each data structure from the artificial neural network operation unit to display the long term characteristic estimation data in a graphic-user interface through a display device.

In the present invention, in case the error is less than a criterion value, the long term characteristic evaluation unit determines any one of the long term characteristic estimation data calculated based on each data structure or average data of the long term characteristic estimation data as a long term characteristic estimation data, and then outputs the long term characteristic estimation data.

Preferably, the long term characteristic evaluation unit determines long term characteristic quality of the battery by comparing the determined long term characteristic estimation data with a criterion long term characteristic data, and the long term characteristic evaluation unit outputs a long term characteristic quality determination result of the battery in a graphic-user interface through a display device.

In another aspect of the present invention, there is also provided a method for estimating long term characteristics of a battery, comprising: receiving initial characteristic learning data and long term characteristic learning data of a battery to be a learning object; converting the received initial characteristic learning data and the received long term characteristic learning data into first and second data structures and then individually allowing an artificial neural network to learn based on each data structure; receiving initial characteristic measurement data of a battery to be an object for estimation of long term characteristics; converting the received initial characteristic measurement data into first and second data structures, then applying the learned artificial neural network corresponding to each data structure thereto, and then calculating and outputting long term characteristic estimation data based on each data structure; and calculating an error of the output long term characteristic estimation data based on each data structure and then determining reliability of the long term characteristic estimation data depending on the error.

BRIEF DESCRIPTION OF THE DRAWINGS

Other objects and aspects of the present invention will become apparent from the following description of embodiments with reference to the accompanying drawing in which:

FIG. 5 is a block diagram showing a system for estimating long term characteristics of a battery according to a second embodiment of the present invention;

FIG. 8 is a block diagram showing an inner configuration of a general-purpose computer adoptable in executing an operation method for the system for estimating long term characteristic of a battery according to the present invention.

BEST MODE FOR CARRYING OUT THE INVENTION

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
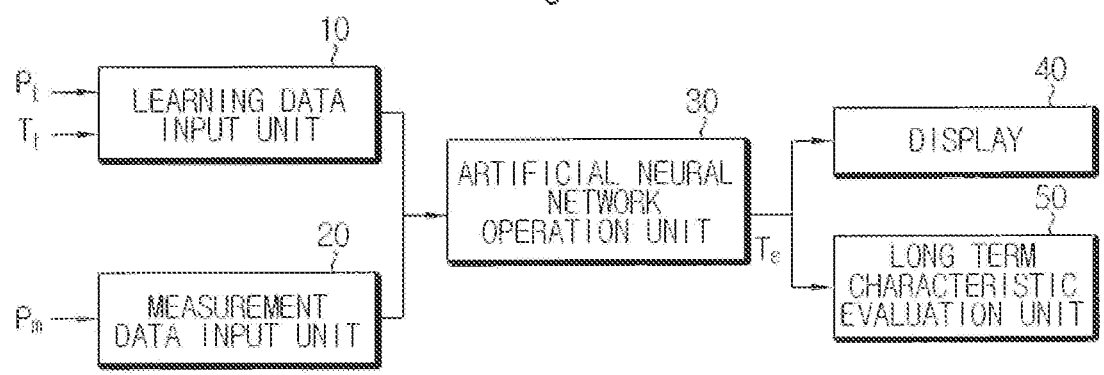
FIG. 1 is a block diagram showing a system for estimating long term characteristics of a battery according to a first embodiment of the present invention.

FIG. 1 is a block diagram showing a system for estimating long term characteristics of a battery according to a first embodiment of the present invention.

Referring to FIG. 1, the system for estimating long term characteristics of a battery according to the present invention is implemented by a general-purpose computer, which includes a learning data input unit 10 for receiving initial characteristic learning data $P_l$ and long term characteristic learning data $T_l$ of a battery to be a learning object; a measurement data input unit 20 for receiving initial characteristic measurement data $P_m$ of a battery to be an object for estimation of long term characteristics; and an artificial neural network operation unit 30 for receiving the initial characteristic learning data $P_l$ and the long term characteristic learning data $T_l$ from the learning data input unit 10 to allow an artificial neural network to learn a correlation of both learning data, receiving the initial characteristic measurement data $P_m$ from the measurement data input unit 20 and applying the learned artificial neural network thereto, and thus calculating long term characteristic estimation data $T_e$ from the initial characteristic measurement data of the battery and outputting the long term characteristic estimation data $T_e$.

The learning data input unit 10 and the measurement data input unit 20 are interfaces to receive various data required for learning of the artificial neural network and calculation of long term characteristic estimation data.

The learning data input unit 10 gives a user interface having a standardized template that designates a medium file on a computer recording initial characteristic learning data and long term characteristic learning data according to a predetermined protocol or allows a user to directly register initial characteristic learning data and long term characteristic learning data, so the learning data input unit 10 may receive initial characteristic learning data and long term characteristic learning data.

In addition, the measurement data input unit 20 gives a user interface having a standardized template that designates a medium file on a computer recording initial characteristic measurement data according to a predetermined protocol or allows a user to directly register initial characteristic measurement data, similarly to the learning data input unit 10, so the measurement data input unit 20 may receive initial characteristic measurement data.

The initial characteristic learning data and the long term characteristic learning data are obtained through a cycle charging/discharging process of a plurality of batteries designated as learning objects. The cycle charging/discharging process means repeating a process of periodically charging and discharging a battery to a certain cycle. One cycle means one charging and one discharging.

The initial characteristic learning data is a characteristic data of a battery to be a learning object, obtained at a cycle conducted in an opening part of the cycle charging/discharging process. Here, the number of cycles at which the initial characteristic learning data is obtained may be changed as desired. For example, the initial characteristic learning data may be a charging characteristic variation data of a battery, a discharging characteristic variation data, a thickness variation data or an open circuit voltage variation data, obtained during 1 to 10 cycles. Here, the charging characteristic is a charging current, a charging voltage or a charging capacity of a battery, and the discharging characteristic is a discharging current, a discharging voltage or a discharging capacity of a battery. However, the present invention is not limited thereto. Thus, it should be understood that any parameter capable of defining a charging characteristic or a discharging characteristic of a battery can be included in the scope of parameter defining the charging/discharging characteristic.

The initial characteristic learning data is a data relating to battery charging characteristic, battery discharging characteristic, battery thickness or battery open circuit voltage, so it is configured as an aggregation of at least two data. For example, if the initial characteristic learning data is configured using a charging capacity variation data of each charging voltage or each charging time for a battery, obtained through a charging/discharging process of 1 to 10 cycles, the initial characteristic learning data includes 10 sets of charging capacity variation data, and the charging capacity variation data of each set includes a plurality of charging capacity values corresponding to a plurality of measurement voltages and measurement times. Here, the measurement voltage and the measurement time for measurement of charging capacity are determined in advance.

The long term characteristic learning data is a charging characteristic variation data, a discharging characteristic variation data, a thickness variation data or an open circuit voltage variation data of a battery, obtained at a cycle conducted in a latter part of the cycle charging/discharging process. Here, the charging characteristic is a charging current, a charging voltage or a charging capacity of a battery, and the discharging characteristic is a discharging current, a discharging voltage or a discharging capacity of a battery. However, the present invention is not limited thereto. Thus, it should be understood that any parameter capable of defining a charging characteristic or a discharging characteristic of a battery can be included in the scope of parameter defining the charging/discharging characteristic. The number of cycles conducted in the latter part is determined depending on the long term characteristic specification of a battery, demanded by clients, and it may be 300 as an example. However, the present invention is not limited to a specific number of cycles at which the long term characteristic learning data is obtained.

The long term characteristic learning data is a data relating to battery charging characteristic, battery discharging characteristic, battery thickness or battery open circuit voltage, so it is configured as an aggregation of at least two data, similarly to the initial characteristic learning data. For example, if the long term characteristic learning data is configured using a charging capacity variation data of each charging voltage or each charging time for a battery, obtained through a charging/discharging process of 300 cycles, the long term characteristic learning data includes a plurality of charging capacity values corresponding to a plurality of charging voltages and charging times, obtained during the battery charging process of 300 cycles. Here, the charging voltage and the charging time for measurement of charging capacity are determined in advance, and they are identical to the charging voltage or the measurement time at which the initial characteristic learning data is obtained.

Meanwhile, the parameter relating to initial characteristics and long term characteristics of a battery are not limited to the above in the present invention, and it is apparent to those having ordinary skill in the art that any characteristic recognizable as a characteristic of a battery should be interpreted as being included in the scope of the initial characteristic learning data and the long term characteristic learning data.

The initial characteristic measurement data is an initial characteristic data directly measured from a battery whose long term characteristic will be evaluated using a cycle charging/discharging process, and attribute and kind of the data are substantially identical to those of the initial characteristic learning data. That is to say, the initial characteristic measurement data is a characteristic data of a battery, obtained at cycles in an opening part of the cycle charging/discharging process, for example charging characteristic variation data, discharging characteristic variation data, thickness variation data or open circuit voltage variation data of a battery obtained for 1 to 10 cycles.

The long term characteristic estimation data is a data calculated by the artificial neural network operation unit 30, and it is not an actually measured data by the cycle charging/discharging process but an estimated data by the artificial neural network. Attribute and kind of the long term characteristic estimation data are substantially identical to those of the long term characteristic learning data. That is to say, the long term characteristic estimation data is charging characteristic variation data, discharging characteristic variation data, thickness variation data or open circuit voltage variation data of a battery estimated for 300 cycles, as an example.

Figure 2:
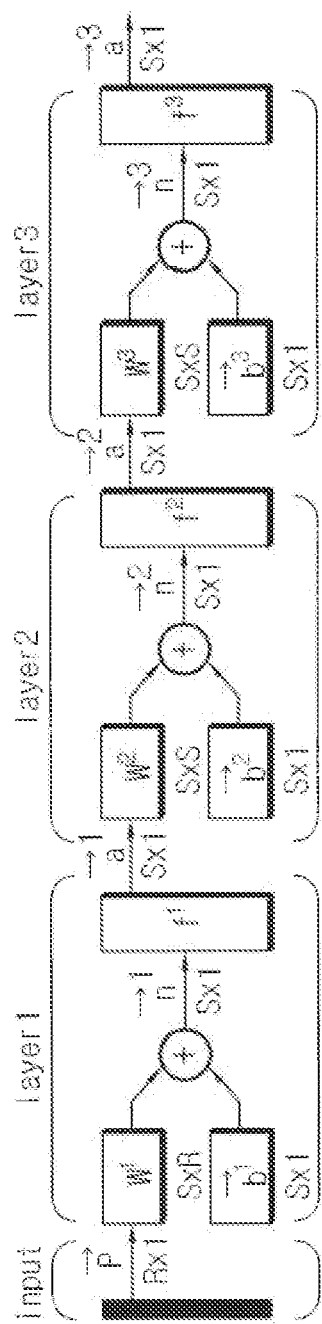
FIG. 2 is a block diagram showing an artificial neural network structure having a learning ability by an artificial neural network operation unit according to an embodiment of the present invention.

FIG. 2 is a block diagram showing an artificial neural network having a learning ability by the artificial neural network operation unit 30 according to an embodiment of the present invention.

Referring to FIG. 2, the artificial neural network having a learning ability by the artificial neural network operation unit 30 includes an arrangement of neuron layers (layer1, layer2, layer3) connected in series. In the figure, three neuron layers are arranged, but the present invention is not limited to the number of neuron layers. For the convenience, the neuron layers (layer1, layer2, layer3) will be called a first neuron layer, a second neuron layer and a third neuron layer, respectively.

The artificial neural network operation unit 30 receives initial characteristic measurement data $P_m$ from the measurement data input unit 20 and converts it into an initial characteristic measurement vector $\vec{P}$, and then inputs it to the first neuron layer (layer1). Here, the initial characteristic measurement vector has a dimension of R row×1 column. R is the number of unit data included in the initial characteristic measurement data. For example, assuming that the initial characteristic measurement data is a charging capacity variation data of a battery measured at regular intervals in a charging/discharging process of 1 to 10 cycles and the number of charging capacity data obtained at each cycle is 20, R is '20×10=100'. In this case, the initial characteristic measurement vector $\vec{P}$ has a dimension of 100 rows×1 column, and 1 to 20 rows, 21 to 40 rows, 41 to 60 rows, . . . , 181 to 200 rows respectively designate charging capacity variation data of 1 cycle, 2 cycle, 3 cycle, . . . , 10 cycle.

In the first neuron layer (layer 1), the initial characteristic measurement vector $\vec{P}$ is multiplied by a weight that is an element of a weight matrix $W^1$, and also added by a bias value that is an element of a bias vector $\vec{b}^1$.

A result at this time, namely an intermediate result $\vec{n}^1$, is calculated into a result vector $\vec{a}^1$ of the corresponding layer by a neuron transfer function $f^1$, and then output as a second neuron layer (layer2). The following equation 1 represents a numerical formula regarding the first neuron layer (layer1).

$$\vec{a}^1 = f^1(W^1\vec{P} + \vec{b}^1) \quad \text{Equation 1}$$

The operation method of the above first neuron layer (layer1) is identically applied to a second neuron layer (layer2) and a third neuron layer (layer3). However, an input vector input to each layer is an output vector of a last layer. The operation methods applied to the second neuron layer (layer2) and the third neuron layer (layer3) are respectively as follows.

$$\vec{a}^2 = f^2(W^2\vec{a}^1 + \vec{b}^2) \quad \text{Equation 2}$$

$$\vec{a}^3 = f^3(W^3\vec{a}^2 + \vec{b}^3) \quad \text{Equation 3}$$

In the equations 1 to 3, the weight vectors $W^1$, $W^2$ and $W^3$ respectively have dimensions of S row×1 column, S row×S column and S row×S column, and the bias vector $\vec{b}^1$, $\vec{b}^2$ and $\vec{b}^3$ have a dimension of S row×1 column. Here, S is the number of rows in a final output vector $\vec{a}^3$ calculated by the artificial neural network. The number of rows in the final output vector $\vec{a}^3$ is identical to the number of unit data included in the long term characteristic estimation data.

In the present invention, the learning of the artificial neural network means obtaining weight matrixes $W^1$, $W^2$ and $W^3$ and bias vectors $\vec{b}^1$, $\vec{b}^2$ and $\vec{b}^3$ so as to minimize or optimize a difference between the final output vector $\vec{a}^3$ and the long term characteristic learning vector $\vec{T}_t$ obtained by vectorizing the long term characteristic learning data $T_t$. For this purpose, the artificial neural network operation unit 30 uses an initial characteristic learning vector $\vec{P}_t$ and a long term characteristic learning vector $\vec{T}_t$, obtained by vectorizing the initial characteristic learning data $P_t$ and the long term characteristic learning data $T_t$.

For example, assuming that the R/k number of initial characteristic data per each cycle are obtained during k cycles for the N number of batteries to be learning objects and then used as initial characteristic learning data and the S number of long term characteristic data in total are obtained for 300 cycles and then used as long term characteristic learning data, weight matrixes $W^1$, $W^2$ and $W^3$ and bias vectors $\vec{b}^1$, $\vec{b}^2$ and $\vec{b}^3$ are obtained by allowing learning of the artificial neural network using $\vec{P}_t$ $=(p_1, p_2, \ldots, p_N)$[R row×N column, $p_1, p_2, \ldots, p_N$ are column vectors] and $\vec{T}_t$ $=(t_1, t_2, \ldots, t_N)$[S row×N column, $t_1, t_2, \ldots, t_N$ are column vectors].

Here, the techniques relating to artificial neural network learning are well known in the related art. For example, Jure Zupan, Johann Gasteiger, "Neural Networks in Chemistry and Drug Design", $2^{nd}$ Edition (Weinheim; New York; Chichester; Brisbane; Singapore; Toronto: Wiley-VCH, 1999) discloses a method for calculating a weight matrix W and a bias vector $\vec{b}$ by means of a correlation between input data and output data. Thus, a detailed learning algorithm of the artificial neural network using $\vec{P}_t$ and $\vec{T}_t$ is not explained in detail here.

The neuron transfer function f is a known transfer function in the field of artificial neural network. For example, Compet, Hard-limit, Symmetric Hard-Limit, Log-Sigmoid, Positive Linear, Linear, Radial Basis, Satlin, Satlins, Softmax, Tan- Sigmoid, Triangular Basis, and Netinv transfer functions may be adopted as the neuron transfer function f. However, the present invention is not limited thereto.

Referring to FIG. 1 again, if the final output vector $\vec{a}^3$ is calculated by the artificial neural network, the artificial neural network operation unit 30 outputs the final output vector (this vector is corresponding to a long term characteristic estimation vector) as a long term characteristic estimation data of the battery. Then, a display 40 receives the long term characteristic estimation data and displays the long term characteristic estimation data in a graphic-user interface through a display device. For example, if the long term characteristic estimation data is a charging capacity variation data of a battery according to a charging time or a charging voltage for 300 cycles, the display 40 may output the charging capacity variation data of the battery, estimated for 300 cycles, in the form of graphic through the display device. In this case, though the cycle charging/discharging process is not conducted up to 300 cycles, the long term characteristics of the battery may be easily estimated.

In another embodiment, if the final output vector $\vec{a}^3$ is calculated by the artificial neural network, the artificial neural network operation unit 30 may output the final output vector to a long term characteristic evaluation unit 50 that evaluates long term characteristics of a battery. Then, the long term characteristic evaluation unit 50 compares the long term characteristic estimation data calculated by the artificial neural network with a predetermined criterion long term characteristic data, and then, if its error is great over a threshold value, the long term characteristic evaluation unit 50 determines that the battery has bad long term characteristics. In this case, the long term characteristic evaluation unit 50 determines that the corresponding battery is inferior in aspect of long term characteristics, and then it may display the result in a graphic-user interface through the display device.

For example, if the long term characteristic estimation data is relating to a charging capacity of each charging time or charging voltage of a battery, estimated for 300 cycles, the long term characteristic evaluation unit 50 may determine that long term characteristic of the corresponding battery is excellent only when the charging capacity estimated by the artificial neural network is greater than a predetermined criterion charging capacity of each charging time or voltage. However, the present invention is not limited thereto in determining excellence of long term characteristics of a battery.

Meanwhile, if the initial characteristic measurement data is out of the range of initial characteristic learning data used for learning of the artificial neural network, the reliability of the long term characteristic estimation data calculated by the artificial neural network is deteriorated.

In order to solve this problem, in another embodiment of the present invention, data structures of initial characteristic learning data and long term characteristic learning data are defined differently such that the learning of the artificial neural network is differently conducted for each data structure.

Figure 3:
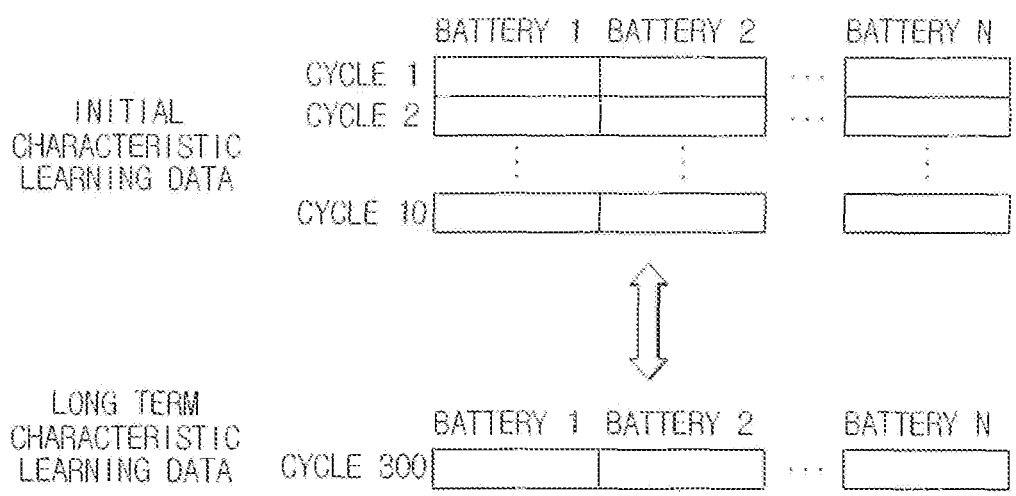
FIG. 3 is a schematic view showing a case that initial characteristic learning data and long term characteristic learning data are defined in a first data structure.
Figure 4:
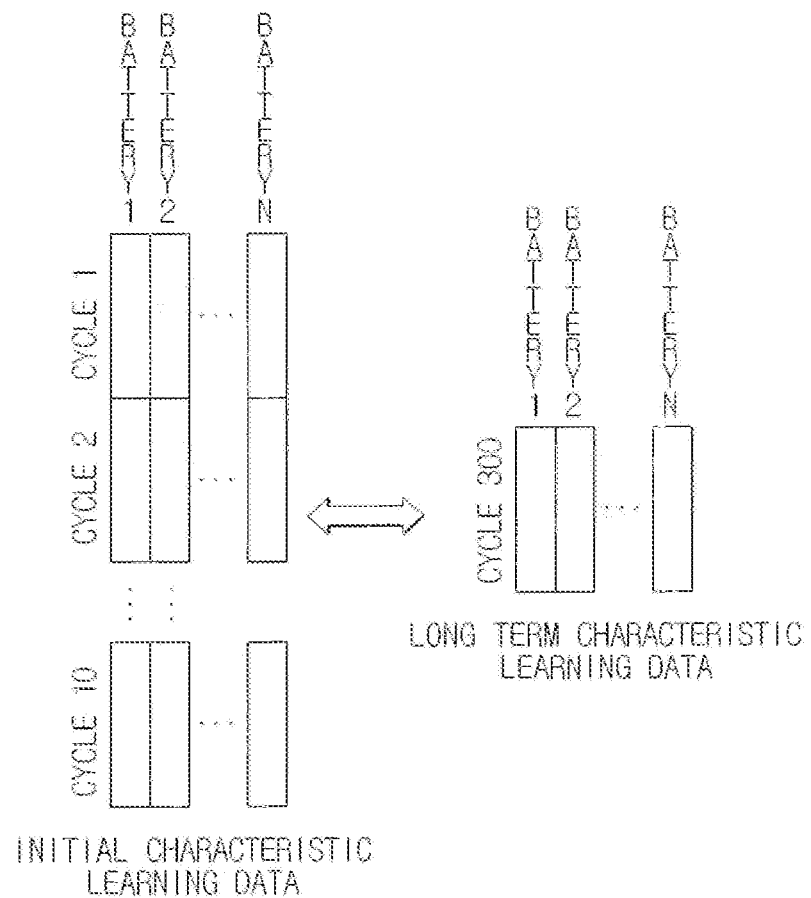
FIG. 4 is a schematic view showing a case that initial characteristic learning data and long term characteristic learning data are defined in a second data structure.

FIG. 3 shows a case that initial characteristic learning data and long term characteristic learning data are defined in a first data structure, and FIG. 4 shows a case that initial characteristic learning data and long term characteristic learning data are defined in a second data structure, respectively.

Referring to the first data structure of FIG. 3, initial characteristic learning data of the same cycle obtained for the N number of batteries to be learning objects are arranged in a lateral direction. For example, in a first row of the initial characteristic learning data, initial characteristic learning data obtained in a charging/discharging process of 1 cycle for battery 1 to battery N are positioned. The other rows are arranged in the same way. Also, in a first row of the long term characteristic learning data, long term characteristic learning data obtained in a charging/discharging process of 300 cycles for battery 1 to battery N are positioned. Here, the range or number of cycles at which the initial characteristic learning data and the long term characteristic learning data are obtained may be changed, as apparent to those having ordinary skill in the art. If the number of learning data obtained for each cycle is k, the initial characteristic learning data having the first data structure becomes a matrix having a dimension of 10 rows×(k*N) column, and the long term characteristic learning data becomes a matrix having a dimension of 1 row×(k*N) column.

Then, referring to the second data structure of FIG. 4, initial characteristic learning data is obtained by executing a charging/discharging process of 1 to 10 cycles for the N number of batteries to be learning objects, but the initial characteristic learning data of 1 to 10 cycles obtained for each battery are subsequently arranged in a vertical direction. Thus, in a first column of the initial characteristic learning data, the initial characteristic learning data obtained in a charging/discharging process of 1 to 10 cycles for battery 1 are subsequently positioned. The other columns are arranged in the same way. Also, in each column of the long term characteristic learning data, the long term characteristic learning data obtained in a charging/discharging process of 300 cycles for battery 1 to battery N are arranged in a vertical direction. Here, the range or number of cycles at which the initial characteristic learning data and the long term characteristic learning data are obtained may be changed, as apparent to those having ordinary skill in the art. If the number of learning data obtained for each cycle is k, the initial characteristic learning data having the second data structure becomes a matrix having a dimension of (k*10) row×N column, and the long term characteristic learning data becomes a matrix having a dimension of k row×N column.

The artificial neural network operation unit 30 converts the initial characteristic learning data and the long term characteristic learning data into the first and second data structures and then allows the artificial neural network to learn individually based on the data structure.

Here, the meaning of allowing the artificial neural network to learn individually based on data structure is individually calculating weight matrixes $W^1$, $W^2$ and $W^3$ and bias vectors $\vec{b}^1$, $\vec{b}^2$ and $\vec{b}^3$ of the artificial neural network based on the first and second data structures.

If the artificial neural network is allowed to learn based on the first data structure, weight matrixes and bias vectors may be calculated such that long term characteristic values measured at a corresponding cycle among 300 cycles may be estimated by column vectors (in a vertical direction) of initial characteristic values measured at a specific cycle among 1 to 10 cycles based on the same batteries to be learning objects. In addition, if the artificial neural network is allowed to learn based on the second data structure, weight matrixes and bias vectors may be calculated such that long term characteristic values for the entire 300 cycles may be estimated by column vectors (in a vertical direction) of initial characteristic values for the entire 1 to 10 cycles based on the same batteries to be learning object.

After the individual learning of the artificial neural network based on the data structure is completed, if initial characteristic measurement data of a battery whose long term characteristics should be determined is input, the artificial neural network operation unit 30 converts the data structure of the initial characteristic measurement data into the first data structure and the second data structure and then applies the learned artificial neural network based on each data structure to calculate two long term characteristic estimation data.

At this time, when calculating long term characteristic estimation data from the initial characteristic measurement data having the first data structure, the artificial neural network operation unit 30 estimates long term characteristic values for 300 cycles corresponding to the location of a column vector by using the column vector composed of initial characteristic values of each measurement time for 1 to 10 cycles. In this method, initial characteristic values are associated at 10 cycles different from each other to estimate long term characteristic data for 300 cycles one by one. Meanwhile, in case long term characteristic estimation data is calculated from the initial characteristic measurement data having the second data structure, a column vector composed of initial characteristic values for the entire 1 to 10 cycles is used to estimate long term characteristic values for the entire 300 cycles. In this method, long term characteristic data for 300 cycles are estimated once with reference to initial characteristic values of the entire 10 cycles.

If the artificial neural network uses different approaches to estimate long term characteristic data for 300 cycles, though artificial neural networks having learned based on different data structures are applied, there is substantially no error between two long term characteristic estimation data if the initial characteristic measurement data does not depart from the range of the initial characteristic learning data. It is because the artificial neural network has well learned to estimate the substantially identical long term characteristic learning data regardless of data structure of the initial characteristic measurement data within the range of initial characteristic learning data used for learning. In other words, if the initial characteristic measurement data departs from the range of the initial characteristic learning data, an error between two long term characteristic estimation data is increased if artificial neural networks having learned based on different data structures are applied. Thus, by using this phenomenon, it is possible to easily evaluate reliability of long term characteristic estimation data.

That is to say, the artificial neural network operation unit 30 obtains two long term characteristic estimation data from initial characteristic measurement data having different data structures, and then outputs them to the long term characteristic evaluation unit 50. Then, the long term characteristic evaluation unit 50 calculates an error between two long term characteristic estimation data, and then, if the error exceeds a threshold value, the long term characteristic evaluation unit 50 determines that the initial characteristic measurement data used for estimating long term characteristics of a battery is out of the qualitative and quantitative range of the initial characteristic learning data used for learning of the artificial neural network. In this case, the long term characteristic evaluation unit 50 may display a message informing of low reliability of the long term characteristic estimation data in a graphic-user interface through the display device.

On the contrary, if an error between two long term characteristic estimation data is lower than a threshold value, the long term characteristic evaluation unit 50 determines that the initial characteristic measurement data used for estimating long term characteristics of a battery is within the qualitative and quantitative range of the initial characteristic learning data used for learning of the artificial neural network. In this case, the long term characteristic evaluation unit 50 finally determines vector any one of the two long term characteristic estimation data or vector average data of the two long term characteristic estimation data as a long term characteristic estimation data and then displays a varying pattern of the long term characteristic estimation data in a graphic-user interface through the display device. Further, the long term characteristic evaluation unit 50 may compare the finally determined long term characteristic estimation data with a criterion long term characteristic data to determine whether the long term characteristics of the battery are excellent, and then display the result in a graphic-user interface through the display device.

The system for estimating long term characteristics of a battery, as explained above, samples a plurality of batteries whose long term characteristics will be estimated for each battery lot after battery production is completed, then conducts a cycle charging/discharging process for each sampled battery to obtain initial characteristic measurement data, and then tests long term characteristics of each sampled battery by using the obtained initial characteristic measurement data, so it may be useful for sampling checking of long term characteristic quality of a battery lot.

FIG. 5 is a block diagram showing a system for estimating long term characteristics of a battery according to a second embodiment of the present invention.

The system for estimating long term characteristics of a battery according to the second embodiment is for estimating long term characteristics of a battery by using a charging characteristic of a battery, measured in a battery activation process.

This system uses a charging voltage variation data, a charging current variation data or a charging capacity variation data of a battery when the battery is initially charged in the battery activation process, as an initial characteristic measurement data of the battery.

Thus, the system according to the second embodiment further includes an initial characteristic measurement sensor 60, differently from the first embodiment. The initial characteristic measurement sensor 60 detects a charging voltage of both terminals of a battery, a charging current introduced into the battery, or a charging capacity of the battery at regular intervals when the battery put into an activation process is initially charged, and then outputs it to the measurement data input unit 20. Then, the measurement data input unit 20 inputs the initial characteristic measurement data output from the initial characteristic measurement sensor 60 into the artificial neural network operation unit 30.

The artificial neural network operation unit 30 receives charging voltage variation data, charging current variation data or charging capacity variation data of a battery, measured in an activation process of a battery designated as a learning object, as initial characteristic learning data and also receives charging characteristic variation data, discharging characteristic variation data, thickness variation data or open circuit voltage variation data of a battery, measured for a predetermined cycles, for example 300 cycles, after putting a battery designated as a learning object, as long term characteristic learning data through the learning data input unit 10, and then allows the artificial neural network to learn. Also, the artificial neural network operation unit 30 calculates and outputs long term characteristic estimation data by applying the learned artificial neural network whenever an initial characteristic measurement data measured at the battery activation process is input from the measurement data input unit 20.

The system of the second embodiment has the may obtain the initial characteristic measurement sensor 60, so it may obtain initial characteristic measurement data from the activation process in real time. Thus, the system of the second embodiment may be applied to the total inspection for long term characteristics of a battery in the battery activation process. Also, the kind of initial characteristic measurement data of the second embodiment, used for calculating initial characteristic learning data and long term characteristic estimation data used for learning of the artificial neural network, is different from that of the first embodiment. Except for the above, the system of the second embodiment is substantially identical to that of the former embodiment.

Now, a method for estimating long term characteristic of a battery according to an embodiment of the present invention is explained.

Figure 6:
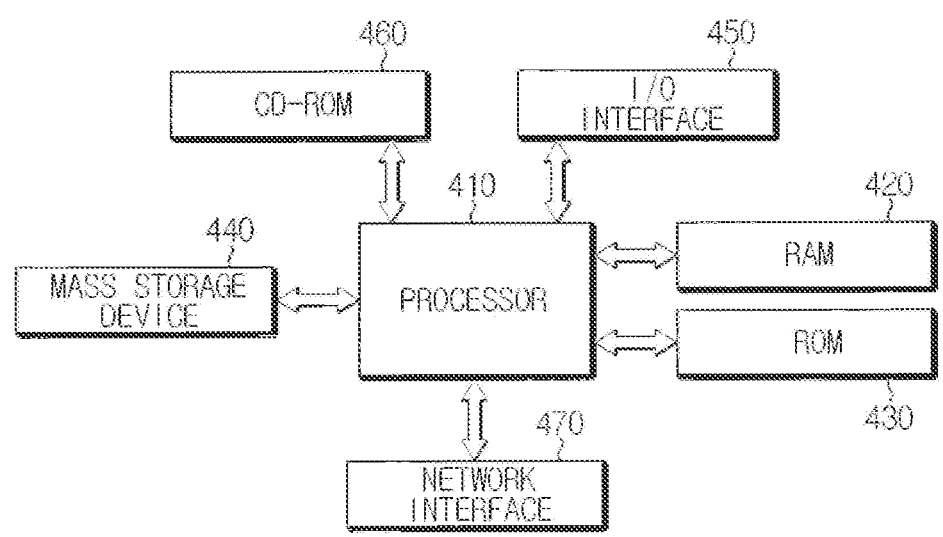
FIG. 6 is a schematic flowchart illustrating an operation sequence of the system for estimating long term characteristic of a battery according to the first embodiment of the present invention.

FIG. 6 is a schematic flowchart illustrating operation sequence of the system for estimating long term characteristics of a battery according to the first embodiment of the present invention.

Referring to FIGS. 1 and 6, first, the artificial neural network operation unit 30 collects initial characteristic learning data and long term characteristic learning data of a battery to be a learning object through the learning data input unit 10 (S100). Here, the initial characteristic learning data and the long term characteristic learning data are already explained above.

Subsequently, the artificial neural network operation unit 30 allows the artificial neural network to learn using the collected initial characteristic learning data and the collected long term characteristic learning data (S110).

After the learning of the artificial neural network is completed, the artificial neural network operation unit 30 receives initial characteristic measurement data of a battery to be an object for estimation of long term characteristics through the measurement data input unit 20 (S120). The initial characteristic measurement data may be obtained in the way of sampling a predetermined number of batteries from a battery lot completely produced, and then executing a cycle charging/discharging process for the sampled batteries. As an alternative, the initial characteristic measurement data may be obtained using the initial characteristic measurement sensor 60 when a battery put into the activation process is initially charged (see FIG. 5).

After that, the artificial neural network operation unit 30 calculates long term characteristic estimation data of predetermined long term cycles by applying the learned artificial neural network to the input initial characteristic measurement data.

And then, the artificial neural network operation unit 30 displays the calculated long term characteristic estimation data on the display 40. Then, the display 40 displays the long term characteristic estimation data in a graphic-user interface through a display device (S140).

As an alternative, the artificial neural network operation unit 30 outputs the calculated long term characteristic estimation data to the long term characteristic evaluation unit 50. Then, the long term characteristic evaluation unit 50 evaluates long term characteristic quality of the battery by comparing the calculated long term characteristic estimation data with a criterion long term characteristic data, and then displays the result in a graphic-user interface through the display device (S150).

Figure 7:
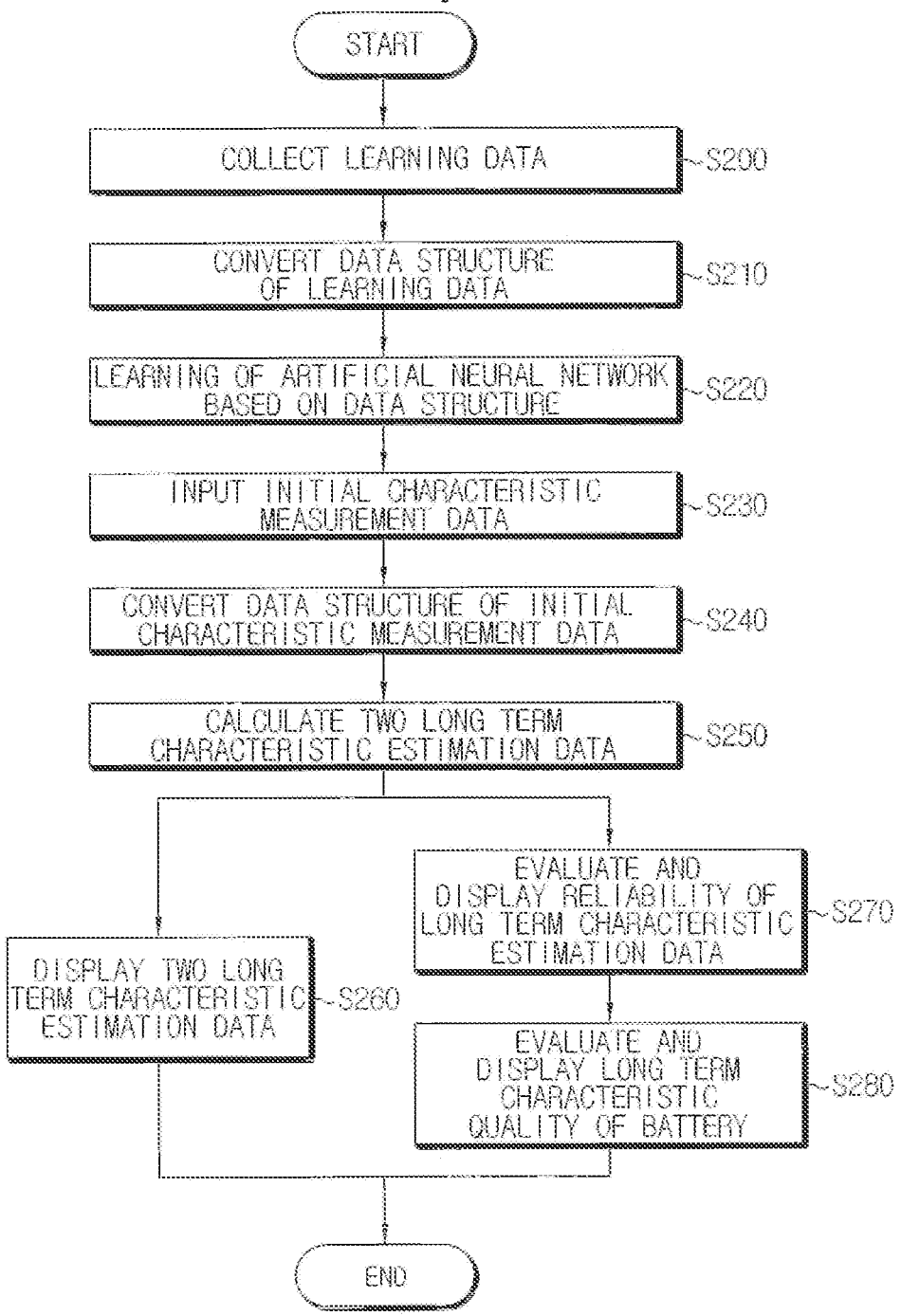
FIG. 7 is a schematic flowchart illustrating an operation sequence of the system for estimating long term characteristic of a battery according to the second embodiment of the present invention.

FIG. 7 is a flowchart illustrating operation sequence of the system for estimating long term characteristics of a battery according to the second embodiment of the present invention.

Referring to FIGS. 1 and 7, first, the artificial neural network operation unit 30 collects initial characteristic learning data and long term characteristic learning data of a battery to be a learning object through the learning data input unit 10 (S200). Here, the initial characteristic learning data and the long term characteristic learning data are already explained above.

Subsequently, the artificial neural network operation unit 30 converts the collected initial characteristic learning data and the collected long term characteristic learning data into first and second data structures (S210). After than, the artificial neural network is allowed to learn based on each data structure (S220). Here, the first and second data structures are already explained above in detail with reference to FIGS. 3 and 4.

After the learning of the artificial neural network based on each data structure is completed, the artificial neural network operation unit 30 receives initial characteristic measurement data of a battery to be an object for estimation of long term characteristics through the measurement data input unit 20 (S230). The initial characteristic measurement data may be obtained in the way of sampling a predetermined number of batteries from a battery lot completely produced, and then executing a cycle charging/discharging process for the sampled batteries. As an alternative, the initial characteristic measurement data may be obtained using the initial characteristic measurement sensor 60 when a battery put into the activation process is initially charged (see FIG. 5).

After that, the artificial neural network operation unit 30 converts the input initial characteristic measurement data into first and second data structures (S240). And then, the learned artificial neural network based on each data structure is applied to the input initial characteristic measurement data according to the first and second data structures, thereby calculating two long term characteristic estimation data for predetermined long term cycles (S250).

And then, the artificial neural network operation unit 30 displays the calculated two long term characteristic estimation data on the display 40. Then, the display 40 displays the two long term characteristic estimation data in a graphic-user interface through a display device (S260).

As an alternative, the artificial neural network operation unit 30 outputs the two calculated long term characteristic estimation data to the long term characteristic evaluation unit 50. Then, the long term characteristic evaluation unit 50 calculates an error between the two long term characteristic estimation data by comparing them with each other, determines the reliability of the long term characteristic estimation data according to whether the error exceeds a threshold value, and then displays the result in a graphic-user interface through the display device (S270).

Further, the long term characteristic evaluation unit 50 decides any one of the two long term characteristic estimation data or their vector average data as long term characteristic estimation data, evaluates long term characteristic quality of the battery by comparing the decided long term characteristic estimation data with a criterion long term characteristic data, and then displays the result in a graphic-user interface through the display device (S280).

The system and method for estimating long term characteristics of a battery according to the present invention may be implemented in a program instruction form capable of being executed by various computer means, and then recorded in a computer-readable medium. The computer-readable medium may include program instructions, data files and data structures, in single or in combination. The program instruction recorded in the medium may be specially designed and configured for the present invention or any other usable one well known in the computer program field. The computer-readable recording medium includes, for example, magnetic media such as a hard disk, a floppy disk and a magnetic tape; optical media such as CD-ROM and DVD; magneto-optical media such as a floptical disk; and hardware devices specifically configured to store and execute program instructions such as ROM, RAM and flash memory. The medium may also be a transmission medium such as a waveguide and an optical or metal wire having a carrier, which transmits a signal designating program instruction or data structure. The program instruction includes, for example, a machine code made by a complier or a high-level programming language code executable by a computer using an interpreter or the like. The hardware device may be configured as being operated as at least one software modules for executing the operations of the present invention, or vice versa.

FIG. 8 is a block diagram showing a general-purpose computer system adoptable for executing the operation method of the system for estimating long term characteristics of a battery according to the present invention.

Referring to FIG. 8, the general-purpose computer system 400 includes at least one processor 410 connected to a main storage device having RAM 420 and ROM 430. The processor 410 is also called CPU. As well known in the art, ROM 430 plays a role of unilaterally transmitting data and instructions to the processor 410. RAM 420 is commonly used for bi-directionally transmitting data and instructions to the processor 410. RAM 420 and ROM 430 may have any suitable shape of a computer-readable medium. A mass storage device 440 is bi-directionally connected to the processor 410 to give an additional data storage capability thereto, and it may be any one of the above computer-readable media. The mass storage device 440 is used for storing programs, data and so on, and it is commonly an auxiliary storage device such as a hard disk, whose speed is lower than a main storage device. A specific mass storage device such as CD-ROM 460 may also be used. The processor 410 is connected to at least one I/O interface 450 such as a video monitor, a trackball mouse, a keyboard, a microphone, a touch screen-type display, a card reader, a magnetic or paper tape reader, a voice or handwriting recognizer, a joystick, or other well-known computer I/O devices. Finally, the processor 410 may be connected to a wired or wireless communication network through a network interface 470. The above method may be executed through the network connection. The above devices and tools are well known to those having ordinary skill in the computer hardware and software fields. Meanwhile, the hardware device may also be configured as being operated as at least one software module so as to execute operations of the present invention.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

INDUSTRIAL APPLICABILITY

According to the present invention, reliable long term characteristics of a battery may be rapidly evaluated using initial characteristics of the battery, so various problems of the conventional post-shipment long term characteristic evaluation method can be solved.

That is to say, it is possible to reduce a cost required for retrieving a battery lot determined as having bad quality. Also, since inferiority factors of long term characteristics may be rapidly recognized and removed, it is possible to prevent addition production of batteries with inferior long term characteristics. In addition, it is possible to supply only batteries with excellent long term characteristics to consumers, and also it is possible to lessen a load on the equipment used for a cycle charging/discharging process of a battery.

In another aspect of the present invention, since characteristics measured for all batteries when the batteries are manufactured, for example a charging data in an activation process, are used, it is possible to realize the entire inspection of the battery.

The invention claimed is:

1. A system for estimating long term characteristics of a battery, comprising:
   a learning data input unit for receiving initial characteristic learning data, obtained at a cycle conducted in an opening part of a repeated cycle charging/discharging process with respect to a battery to be a learning object and long term characteristic learning data, obtained at a cycle conducted in a latter part of the cycle charging/discharging process;
   a measurement data input unit for receiving initial characteristic measurement data, obtained at a cycle conducted in an opening part of the cycle charging/discharging process with respect to a battery to be an object for estimation of long term characteristics;
   an artificial neural network operation unit for converting the initial characteristic learning data and the long term characteristic learning data into first and second data structures, allowing an artificial neural network to learn the initial characteristic learning data and the long term characteristic learning data based on each data structure, converting the input initial characteristic measurement data into first and second data structures, and individually applying the learned artificial neural network corresponding to each data structure to calculate and output long term characteristic estimation data based on each data structure; and
   a long term characteristic evaluation unit for calculating an error of the output long term characteristic estimation data of each data structure and determining reliability of the long term characteristic estimation data depending on the error.

2. The system according to claim 1,
   wherein the learned artificial neural network based on each data structure has at least one neuron layer arranged in series, and
   wherein the neuron layer converts an input vector into an output vector such that a bias vector and a weight matrix calculated by the learning of the artificial neural network are reflected on the input vector, the input vector on which the bias vector and the weight matrix are reflected is processed by a neuron transfer function, and then result of the neuron transfer function is output as an output vector.

3. The system according to claim 2,
   wherein, in the serial arrangement of the neuron layer, the first neuron layer has an input vector composed of initial characteristic measurement data.

4. The system according to claim 1,
wherein the data relating to initial characteristics includes a charging characteristic variation data of a battery, measured in a battery activating process; or a charging characteristic variation data, a discharging characteristic variation data, a thickness variation data, or an open circuit voltage variation data of a battery, obtained by measurement of initial cycle characteristics, and
wherein the data relating to long term characteristics includes a charging characteristic variation data, a discharging characteristic variation data, a thickness variation data, or an open circuit voltage variation data of a battery at predetermined long term cycles.

5. The system according to claim 1, further comprising an initial characteristic measurement sensor for measuring a charging characteristic of a battery put into an activating process and then outputting the measured charging characteristic as an initial characteristic measurement data,
wherein the measurement data input unit receives the initial characteristic measurement data from the initial characteristic measurement sensor.

6. The system according to claim 1, further comprising a display for receiving the long term characteristic estimation data calculated based on each data structure from the artificial neural network operation unit to display the long term characteristic estimation data in a graphic-user interface through a display device.

7. The system according to claim 1,
wherein, in case the error is less than a criterion value, the long term characteristic evaluation unit determines any one of the long term characteristic estimation data calculated based on each data structure or average data of the long term characteristic estimation data as a long term characteristic estimation data, and then outputs the long term characteristic estimation data.

8. The system according to claim 7,
wherein the long term characteristic evaluation unit determines long term characteristic quality of the battery by comparing the determined long term characteristic estimation data with a criterion long term characteristic data.

9. The system according to claim 8,
wherein the long term characteristic evaluation unit outputs a long term characteristic quality determination result of the battery in a graphic-user interface through a display device.

10. A method for estimating long term characteristics of a battery, comprising:
(a) receiving initial characteristic learning data and long term characteristic learning data, respectively obtained at a cycle conducted in an opening part and at a cycle conducted in an opening part of a repeated cycle charging/discharging process with respect to a battery to be a learning object;
(b) converting the received initial characteristic learning data and the received long term characteristic learning data into first and second data structures and then individually allowing an artificial neural network to learn based on each data structure;
(c) receiving initial characteristic measurement data, obtained at a cycle conducted in an opening part of the cycle charging/discharging process with respect to a battery to be an object for estimation of long term characteristics;
(d) converting the received initial characteristic measurement data into first and second data structures, then applying the learned artificial neural network corresponding to each data structure thereto, and then calculating and outputting long term characteristic estimation data based on each data structure; and
(e) calculating an error of the output long term characteristic estimation data based on each data structure and then determining reliability of the long term characteristic estimation data depending on the error.

11. The method according to claim 10,
wherein the learned artificial neural network based on each data structure has at least one neuron layer arranged in series, and
wherein, in the step (d), the process of applying the learned artificial neural network based on each data structure includes:
(d1) converting the initial characteristic measurement data into an input vector;
(d2) inputting the converted input vector into a first neuron layer of the neuron layer arrangement;
(d3) each neuron layer of the neuron layer arrangement reflecting a bias vector and a weight matrix calculated by the learning of the artificial neural network on the input vector and then processing the input vector by a neuron transfer function such that the input vector is converted into an output vector and then output; and
(d4) a last neuron layer of the neuron layer arrangement outputting a long term characteristic estimation vector as an output vector.

12. The method according to claim 10,
wherein the data relating to initial characteristics includes a charging characteristic variation data of a battery, measured in a battery activating process; or a charging characteristic variation data, a discharging characteristic variation data, a thickness variation data, or an open circuit voltage variation data of a battery, obtained by measurement of initial cycle characteristics, and
wherein the data relating to long term characteristics includes a charging characteristic variation data, a discharging characteristic variation data, a thickness variation data, or an open circuit voltage variation data of a battery at predetermined long term cycles.

13. The method according to claim 10,
wherein the initial characteristic learning data is a charging characteristic variation data of the battery to be a learning object, put into a battery activating process, and the long term characteristic learning data is a charging characteristic variation data, a discharging characteristic variation data, a thickness variation data, or an open circuit voltage variation data of the battery to be a learning object at predetermined long term cycles, and
wherein the step (c) includes:
putting the battery to be an object for long term characteristic estimation into the battery activating process;
measuring a charging characteristic variation from the battery; and receiving the measured charging characteristic variation data as an initial characteristic measurement data.

14. The method according to claim 10, further comprising: visually displaying the long term characteristic estimation data.

15. The method according to claim 10, further comprising:

determining any one of the long term characteristic estimation data calculated based on each data structure or average data of the long term characteristic estimation data as a long term characteristic estimation data;

comparing the determined long term characteristic estimation data with a criterion long term characteristic data to determine long term characteristic quality of the battery.

16. The method according to claim 15, further comprising: visually displaying a long term characteristic quality determination result of the battery.

* * * * *